(12) United States Patent
Yoshii et al.

(10) Patent No.: US 7,007,140 B2
(45) Date of Patent: Feb. 28, 2006

(54) STORAGE DEVICE, STORAGE DEVICE CONTROLLING METHOD, AND PROGRAM

(75) Inventors: Takeo Yoshii, Yokohama (JP); Masahiko Shimizu, Yokohama (JP)

(73) Assignee: Tokyo Electron Device Limited, Kanagawa (JP)

( * ) Notice: Subject to any disclaimer, the term of this patent is extended or adjusted under 35 U.S.C. 154(b) by 319 days.

(21) Appl. No.: 10/663,078

(22) Filed: Sep. 15, 2003

(65) Prior Publication Data

US 2004/0064636 A1   Apr. 1, 2004

Related U.S. Application Data

(63) Continuation of application No. PCT/JP02/02442, filed on Mar. 14, 2002.

(30) Foreign Application Priority Data

Mar. 16, 2001  (JP)  .............................. 2001-076945

(51) Int. Cl.
*G06F 13/00*  (2006.01)
(52) U.S. Cl. ...................... 711/154; 711/103; 711/156; 365/185.09; 365/185.29; 365/185.33
(58) Field of Classification Search ..................... None
See application file for complete search history.

(56) References Cited

FOREIGN PATENT DOCUMENTS

| EP | 0613151 A2 | 8/1994 |
| EP | 0803812 A1 | 10/1997 |
| GB | 2251324 A | 7/1992 |
| JP | H6-139140 A | 5/1994 |
| JP | H10-83309 A | 3/1998 |
| JP | 2000-011677 | 1/2000 |
| JP | 2000-305839 | 2/2000 |

*Primary Examiner*—Gary Portka
*Assistant Examiner*—Jasmine Song
(74) *Attorney, Agent, or Firm*—Mitchell P. Brook; Luce, Forward, Hamilton & Scripps LLP

(57) ABSTRACT

A first storage unit is accessed randomly in a unit equal to or greater than a predetermined data unit. The first storage unit stores a target program required to be read randomly in a unit smaller than the data unit to execute. A second storage unit stores a reading program for reading the target program from the first storage unit. A control unit reads the target program from the first storage unit according to the reading program of the second storage unit. The control unit stores the read target program to a third storage unit that can be accessed in a unit smaller than the data unit. The control unit executes the target program stored in the third storage unit to gain access randomly to the first storage unit in a unit smaller than the data unit in a quasi manner.

11 Claims, 4 Drawing Sheets

STORAGE DEVICE, STORAGE DEVICE CONTROLLING METHOD, AND PROGRAM

This application is a continuation of international application No. PCT/JP02/02442, filed Mar. 14, 2002.

TECHNICAL FIELD

The present invention relates to a storage device, a storage device controlling method and a program for controlling the storage device.

BACKGROUND ART

Flash memory is known as small-size memory device and used to store data or program in storage device. The flash memory is roughly categorized into NOR-type and NAND-type.

The NOR-type flash memory can be accessed by random accessing method. Also, the NOR-type flash memory is expensive in price per storage capacity and is lower density than the NAND-type flash memory.

The NAND-type flash memory is not expensive and is higher density than the NOR-type flash memory. However, NAND type flash memory should be accessed by page as access unit. For example bytes contained in a page are 512 bytes. Moreover, each of data in a page must read or write in sequentially.

For this reason, a CPU (Central Processing Unit) and the like cannot read or write in directory the program or the data that stored in NAND-type flash memory using random accessing method to execute its instruction or to read/write the data.

The conventional storage device comprises NAND type flash memory is using simulated accessing method by program or device driver to enable random accessing from the CPU. The program or device driver is stored in nonvolatile memory that can access random addressing from the CPU. The nonvolatile memory is a NOR type flash memory or programmable ROM (Read Only Memory) and the like.

After power-on or reset, the CPU reads the program or device driver from the nonvolatile memory and stores the program or device driver to RAM (Random Access Memory). Then the CPU executes the program or device driver for reading and writing the data to/from NAND type flash memory using random accessing method.

However, according to the aforementioned technique, expensive NOR type flash memory is required to store the device driver. For this reason, the structure of storage device becomes complicated to increase in the size, resulting in an expensive storage.

The fundamental structure and operations of the NAND-type flash memory are explained in the catalogue of TC58128AFT (TOSHIBA), for example.

DISCLOSURE OF INVENTION

Accordingly, it is an object of the present invention is to provide a low cost storage with a simple structure.

It is also an object of the present invention to provide a controlling method for implementing a low cost storage with a simple structure and a program.

In order to attain the above objects, according to a first aspect of the present invention, there is provided a storage device comprising:

a first storage unit that comprises a non-volatile storage area made of a plurality of blocks each made of a plurality of memory pages each including a data area for storing data and a redundant area storing a data identification flag indicating whether or not the data stored in said data area is structural data configuring a target program to be executed, and that is accessed in a sequential manner by a unit of said memory page;

a second storage unit that comprises a non-volatile storage area and that stores a reading program for reading said target program from said first storage unit;

a third storage unit that comprises a volatile storage area accessed randomly and that stores said target program read from said first storage unit; and a control unit that specifies a memory page storing said structural data by using said data identification flag stored in said redundant area of said first storage unit and reads said structural data from said data area of said specified memory page according to said reading program stored in said second storage unit, stores said target program configured by said read structural data in said third storage unit, and executes said target program stored in said third storage unit.

The reading program may include a program that causes said control unit to specify a memory page that stores said structural data from said plurality of memory pages.

The first storage unit may be formed of NAND type flash memory.

The reading program may include a program that causes said control unit to detect said data identification flag stored in each of said plurality memory pages and to specify a memory page that stores said structural data using said data identification flag.

The target program may be a device driver that makes it possible for said control unit to gain access to the first storage unit randomly in a smaller unit than said memory page unit in a quasi manner; and said control unit may execute said device driver stored in said third storage unit to gain access to said first storage unit randomly in a smaller unit than said memory page unit in a quasi manner.

Each of said plurality of memory pages may be assigned a logical address for specifying the memory page; and said device driver may include a program that causes said control unit to obtain a logical address for specifying a memory page to be accessed and to gain access to the memory page to which the same logical address as said obtained logical address is assigned.

The second storage unit may obtain said read program supplied externally and stores said obtained reading program.

In order to attain the above objects, according to the second aspect of the present invention, there is provided a storage device controlling method comprising the steps of:

specifying a memory page that stores structural data configuring a target program to be executed, from a first storage unit which comprises a non-volatile storage area made of a plurality of blocks each made of a plurality of memory pages each including a data area for storing data and a redundant area for storing a data identification flag indicating whether or not the data stored in said data area is said structural data and which is accessed in a sequential manner in a unit of each said memory page, by using said data identification flag stored in said redundant area according to a reading program for reading said target program;

reading said structural data from said data area of said specified memory page according to said reading program;

storing said target program configured by said read structural data to a third storage unit that comprises a volatile storage area and can be accessed randomly; and executing said target program stored in said third storage unit.

In order to attain the above objects, according to the third aspect of the present invention, there is provided a program products for controlling a computer comprising:

a first storage unit that comprises a non-volatile storage unit made of a plurality of blocks each made of a plurality of memory pages each including a data area for storing data and a redundant area for storing data identification flag indicating whether or not the data stored in said data area is structural data configuring a target program to be executed, and that is accessed in a sequential manner by a unit of said memory page;

a second storage unit that comprises a non-volatile storage area and that stores a reading program for reading said target program from said first storage unit; and a third storage unit that comprises a volatile storage area accessed randomly and that stores said target program read from said first storage unit, and said program causing said computer to specify a memory page storing said structural data by using said data identification flag stored in said redundant area of said first storage unit and read said structural data from said data area of said specified memory page according to said reading program stored in said second storage unit, store said target program configured by said read structural data in said third storage unit, and execute said target program stored in said third storage unit.

BRIEF DESCRIPTION OF DRAWINGS

These objects and other objects and advantages of the present invention will become more apparent upon reading of the following detailed description and the accompanying drawings in which.

BEST MODE FOR CARRYING OUT THE INVENTION

An explanation will be next given of the storage device and storage controlling method according to the embodiment of the present invention using the flash memory drive device as an example.

Figure 1:
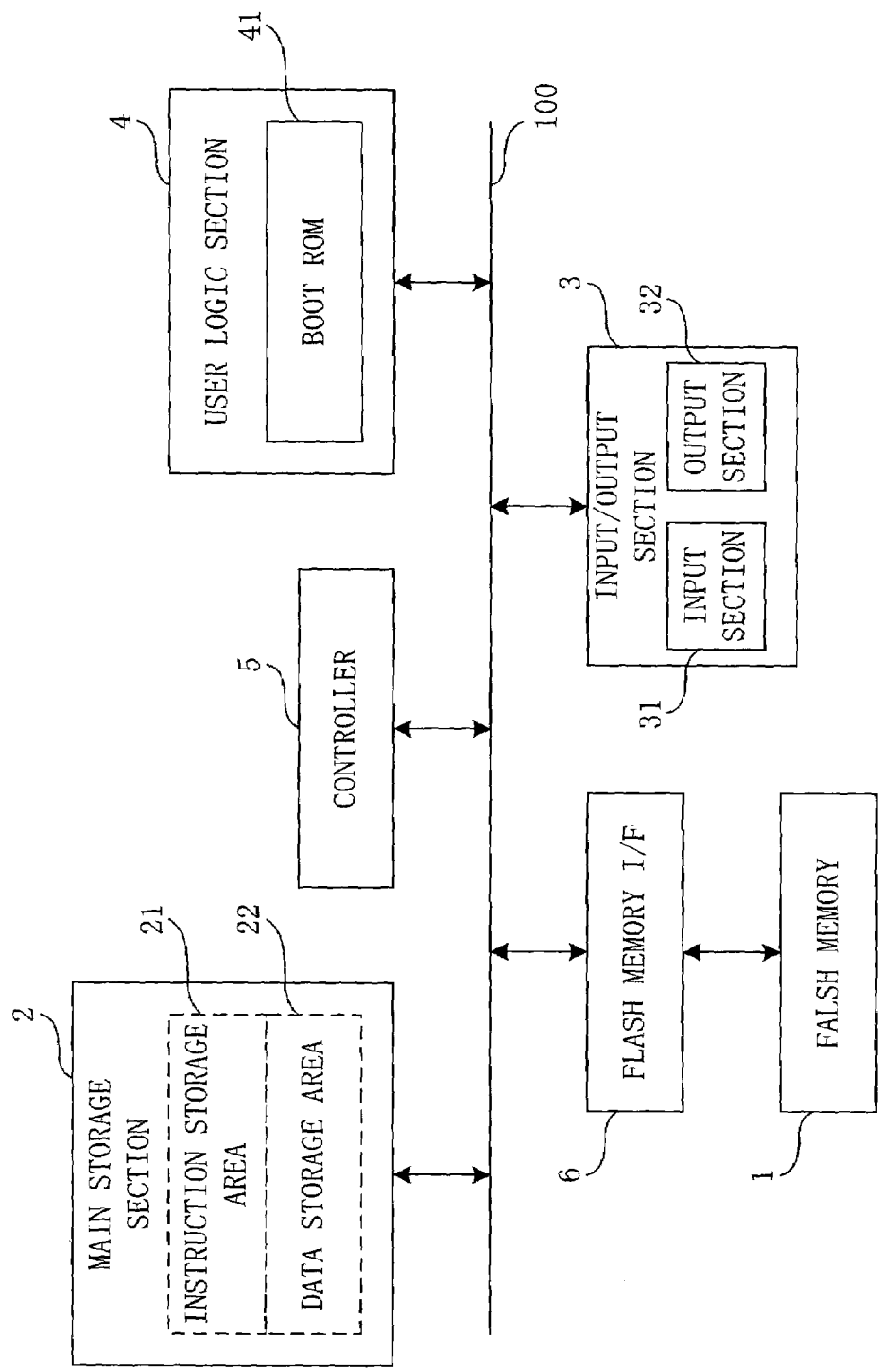
FIG. 1 is a structural view of a flash memory drive device according to the embodiment of the present invention.

The flash memory drive device comprises flash memory 1, main storage section 2, input/output (I/O) section 3, user logic section 4, controller 5, and flash memory I/F (Inter-Face) 6, as shown in FIG. 1.

The main storage section 2, I/O section 3, user logic section 4, controller 5, and flash memory I/F 6 are connected to one another via an internal bus 100. The flash memory 1 is fixedly connected to the flash memory I/F 6, and further connected to the internal bus 100 via the flash memory I/F 6.

The flash memory 1 is a NAND type flash memory and cannot be randomly accessed on a byte-by-byte basis. The minimum random accessible data unit is one page (512 bytes for TC58128AFT).

The flash memory 1 stores user data that the user of flash memory drive device uses. Moreover, the flash memory 1 stores a device driver that allows the controller 5 to implement random access to the flash memory 1 on a byte-by-byte basis in a quasi manner. In addition, when the device driver is executed by the controller 5, the device driver is required to be read at random on a byte-by-byte basis by the controller 5.

The main storage 2 is used by the controller 5 in order to execute various kinds of programs (processing) at high speed. The main storage 2 can be accessed at random on a byte-by-byte basis, and comprises RAM (Random Access Memory) that can read and write data at higher speed than that of the flash memory 1. The main storage 2 has an instruction storage area 21 and a data storage area 22 as illustrated in FIG. 1.

The instruction storage area 21 stores the device driver when the controller 5 executes the device driver.

The data storage area 22 stores data, which is necessary for the controller 5 to execute predetermined processing. Specific data stored in the data storage area 22 will be described later.

The I/O section 3 inputs various kinds of instructions and data to the controller 5 according to the operation that is carried out by the user of flash memory drive device. Moreover, the I/O section 3 outputs data supplied from the controller 5 according to control of the controller 5.

More specifically, the I/O section 3 is composed of an input section 31 and an output section 32.

The input section 31 has a keyboard, a mouse, and a recording medium driver that reads data from a recording medium. The input section 31 inputs an instruction that the user enters to the controller 5 according to the user's operation. Moreover, the input section 31 reads data from the recording medium and supplies it to the controller 5 according to the user's operation.

The output section 32 has a liquid crystal display and a recording medium driver that writes data onto the recording medium. The output section 32 displays data supplied from the controller 5 according to control of the controller 5. Moreover, the output section 32 records data supplied from the controller 5 according to control of the controller 5.

The recording medium driver, which comprises the input section 31 and output section 32, is for example, a floppy disk driver or MO (Magneto Optical) disk driver. In addition, one recording medium driver may be shared between the input section 31 and output section 32.

The user logic section 4 comprises a logic circuit including PLA (Programmable Logic Array) and FPGA (Field Programmable Gate Array), and has boot ROM (Read Only Memory) 41.

The boot ROM 41 comprises PROM (Programmable ROM), FPGA and the like. The boot ROM 41 stores a control code including a program, which controls the operation of controller 5 that reads the device driver from the flash memory 1.

The controller 5 comprises a CPU (Central Processing Unit), etc. The controller 5 reads the device driver stored in the flash memory 1 according to the control code stored in the boot ROM 41, and stores it to the instruction storage area 21 of main storage section 2.

Moreover, the controller 5 reads data stored in the flash memory 1 in response to the instruction input from the input section 31, and sends it to the output section 32. Still moreover, the controller 5 stores data sent from the input section 31 to the flash memory 1 in response to the instruction input from the input section 31. In this case, the controller 5 executes the device driver stored in the instruction storage area 21 so as to gain random access to the flash memory at random on a byte-by-byte basis in a quasi manner.

The flash memory I/F 6 acts as an intermediate role between the controller 5 and the flash memory 1 when the controller 5 accesses to the flash memory 1. More specifically, the flash memory I/F 6 stores data sent from the controller 5 to the flash memory 1 according to the instruction that the controller 5 outputs in accordance with the control code or device driver. Moreover, the flash memory I/F 6 reads data specified by the controller 5 according to the instruction that the controller 5 outputs in accordance with the control code or device driver, and sends it to the controller 5.

An explanation will be next given of the structure of the storage area that the flash memory 1 has.

The flash memory 1 comprises approximately 553 million memory cells, each having one bit storage capacity, arranged in a matrix manner of 131072×528×8 in a logical way of saying. Namely, the flash memory 1 has a storage capacity of about 69 megabytes.

Figure 2:
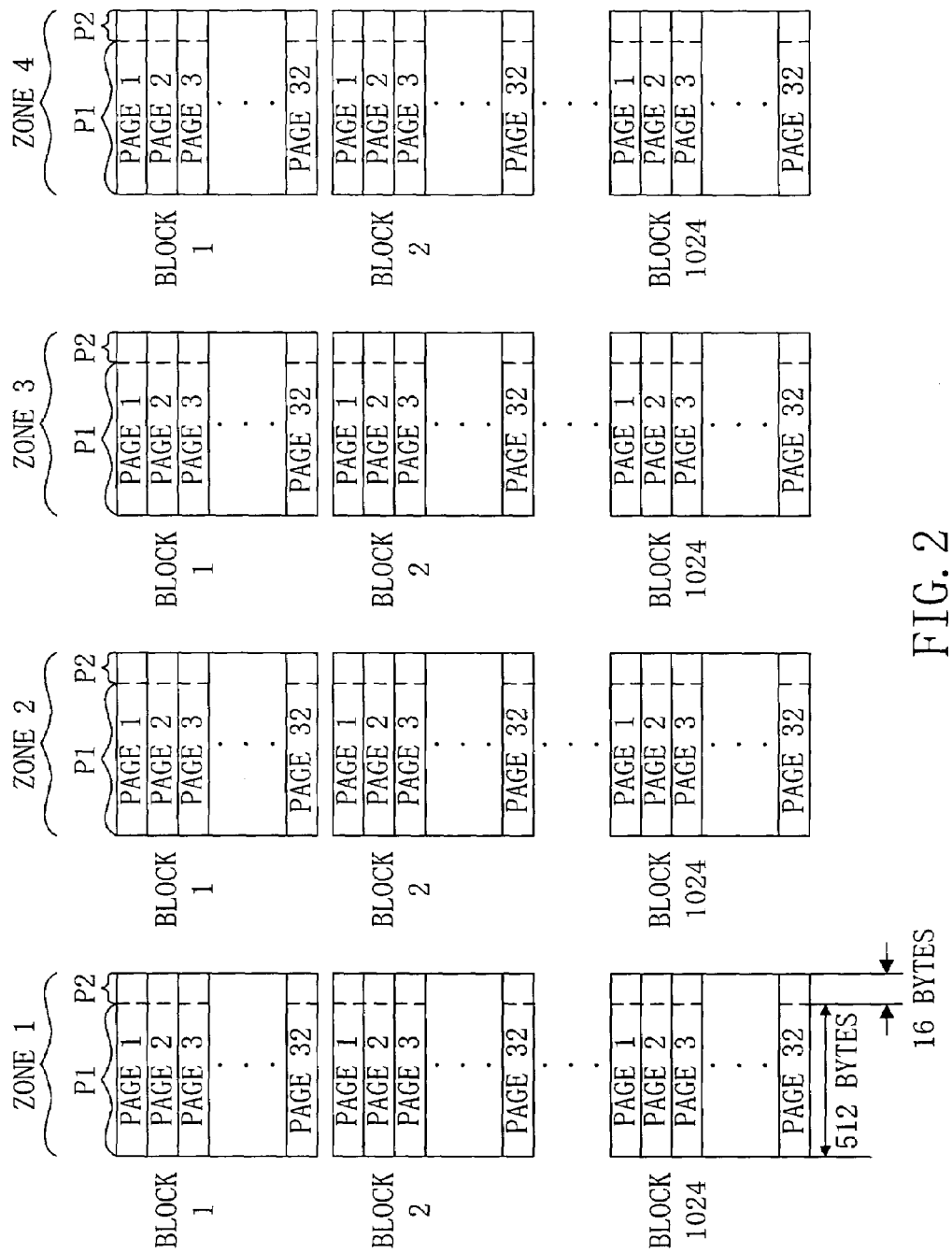
FIG. 2 is a structural view of a storage area provided in the flash memory that forms the flash memory drive device.

The storage area is divided into four zones (zone 1, zone 2, zone 3, and zone 4) each having 32768 pages from the top as illustrated in FIG. 2. The zones 1 to 4 are assigned zone addresses "1, 2, 3, and 4", respectively to identify each zone.

Each zone is divided into 1024 blocks each having 32 pages from the top. The blocks included in each zone are assigned physical block addresses "1 to 1024" continuously in order of arrangement to identify each block. The data stored in a block including the target data to be erased is entirely erased. In other words, data stored in the flash memory 1 is erased in the unit of each block.

Each block comprises 32 pages each having 528-bytes memory cells arranged on one line. Pages included in each block are assigned page addresses "1 to 32" continuously in order of arrangement to identify each page.

The memory cells, which form each page, are assigned data addresses "1 to 528" continuously in order of arrangement to identify each memory cell (or data stored in the memory cell).

Each page is composed of a data area P1 with 512 bytes from the top and a redundant area P2 with the residual 16 bytes. The data area P1 stores user data that is used by the user of flash memory drive device or driver data that forms the device driver. The redundant area P2 stores an error check code, a logical block address, an error flag, and a system flag.

The error check code indicates whether or not data stored in the data area P1 where the corresponding page is stored is corrupted.

The logical block address is a logical address, which is used so that the I/O section 3 or controller 5 specifies the block where the corresponding page is stored. An address conversion table showing the corresponding relationship between the logical block address and the physical block address is stored in the data storage area 22 of main storage section 2 to be described later.

In addition, the total number of blocks to which logical block addresses are assigned is smaller than the number of blocks that the flash memory 1 physically has, and is larger than the number of blocks that is necessary to store data. For example, if the number of blocks that is necessary to store data is 1,000, the total number of blocks to which the physical block addresses are assigned may be 1,001.

The error flag indicates the block where the corresponding page is included is a good block, an initial defective block, or a post defective block.

The good block is a block where data can be normally stored. The initial defective block is one that is determined as being defective before shipment by the manufacturer of flash memory 1. The post defective block is one that is determined as a block where data cannot be normally stored during the use of flash memory 1 or a block where driver data that forms the device driver is stored.

The system flag indicates whether or not data stored in the data area PI where the corresponding page is stored is driver data.

An explanation will be next given of the operations of flash memory drive device.

When the flash memory drive device is powered, the controller 5 gains access to the boot ROM 41 of user logic section 4.

Then, the controller 5 reads a control code stored in the boot ROM 41 and executes device driver read processing explained blow according to the read control code. Resultantly, the controller 5 reads the device driver from the flash memory 1, and stores it in the main memory 2.

Figure 3:
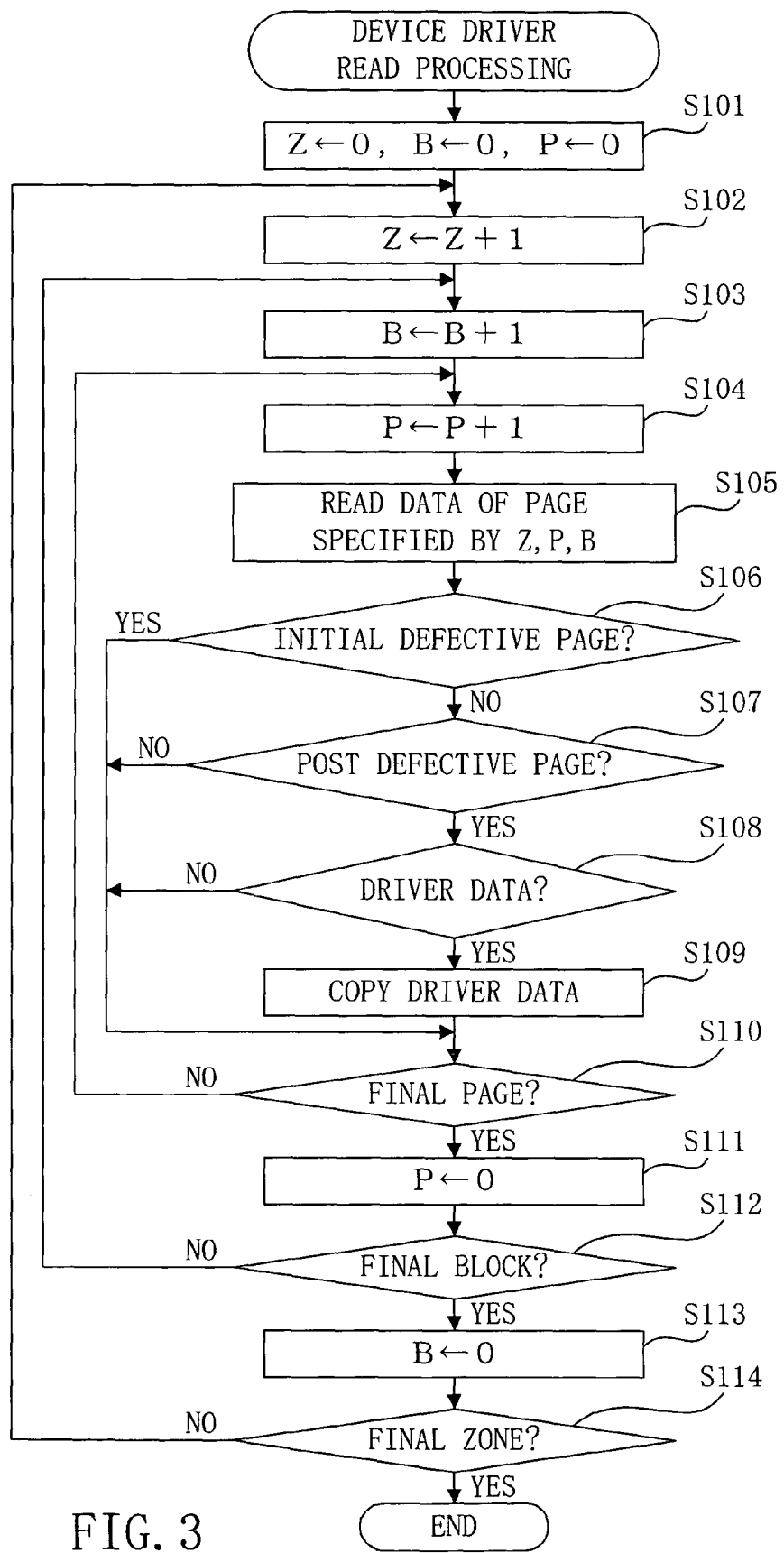
FIG. 3 is a flowchart illustrating device driver read processing performed by a controller that forms the flash memory drive device.

FIG. 3 is a flowchart illustrating device driver read processing that is performed by the controller 5.

First, the controller 5 declares the use of variables Z, B, and P for specifying a page to be processed from among the plurality of pages that forms the storage area of flash memory 1. The variable Z designates a zone of the storage area. The variable B designates a block in the specified zone. The variable P designates a page in the specified block. The controller 5 assigns an initial value "0" to each of the declared variables Z, B, P (step S101).

More specifically, the controller 5 ensures areas for storing the values of variables Z, B, and P in the data storage area 22 of main storage 2. Then, the controller 5 stores value "0" of each of variables Z, B and P into each of the ensured areas.

Next, the controller 5 increments the value of variable Z. More specifically, the controller 5 increments the value of variable Z stored in the data storage area 22 by 1 (step S102).

Sequentially, the controller 5 increments the value of variable B. More specifically, the controller 5 increments the value of variable B stored in the data storage area 22 by 1 (step S103).

Moreover, the controller 5 increments the value of variable P. More specifically, the controller 5 increments the value of variable P stored in the data storage area 22 by 1 (step S104).

After that, the controller 5 reads data stored in the processing page to be specified by variables Z, B and Z from the flash memory 1, and temporarily stores it in the data storage area 22 of main storage 2 (step S105). In this case, the controller 5 reads data stored in the processing page sequentially. In other words, the controller 5 reads 528-byte data on a byte-by-byte basis in 528 times in decreasing or increasing order of data address.

The controller 5 determines whether or not the processing page is a page (initial defective page) included in the initial defective block with reference to the error flag included in the redundant area P2 read in step S105 (step S106).

In the case where the processing page is determined as an initial defective page (step S106; YES), the controller 5 performs processing in step S110 to be described later.

While, in the case where the processing page is not determined as an initial defective page (step S106; NO), the controller 5 determines whether or not the processing page is a page (post defective page) included in the post defective block with reference to the error flag of data read in step S105 (step S107).

In the case where the processing page is not determined as a post defective page (step S107; NO), the controller 5 performs processing in step S110 to be described later.

As explained above, driver data that forms the device driver is stored in the post defective block. For this reason, in the case where the processing page is determined as a post defective page (step S107; YES), the controller 5 determines whether or not data stored in the data area P1 read in step S105 is driver data with reference to the system flag included in the redundant area P2 of data read in step S105 (step S108).

In the case where data of the data area P1 is not determined as driver data (step S108; NO), the controller 5 performs processing in step S110 to be described later.

While, in the case where data of the data area P1 is determined as driver data (step S108; YES), the controller 5 copies driver data (leading 512-byte data) stored in the data area P1 of data read in step S105 to the instruction storage area 21 from the data storage area 22 (step S109).

Then, the controller 5 determines whether or not the processing page is a final page in the block specified by the variables Z and B (step S110). For example, the controller 5 determines whether or not the value of variable P matches the number of pages "32" included in one block to determine whether or not the processing page is the final page.

In the case where the processing page is not determined as a final page (step S110; NO), the controller 5 returns to step S104. Then, the controller 5 performs processing in steps S105 to 110 in connection with a next page.

While, in the where the processing page is determined as a final page (step S110; YES), the controller 5 resets the value of variable P to "0" (step S1).

After that, the controller 5 determines whether or not the processing block specified by variables Z and B is a final block in the zone specified by the variables Z (step S112). For example, the controller 5 determines whether or not the value of variable B matches the number of blocks "1024" included in one zone to determine whether or not the processing block is the final block.

In the case where the processing block is not determined as a final block (step S112; NO), the controller 5 returns to step S103. Then, the controller 5 performs processing in steps S104 to 112 in connection with a next block.

While, in the where the processing block is determined as a final block (step S112; YES), the controller 5 resets the value of variable B to "0" (step S11).

Then, the controller 5 determines whether or not the processing zone specified by variable Z is a final zone in the storage area that the flash memory 1 has (step S114). For example, the controller 5 determines whether or not the value of variable Z matches the number of zones "4" included in the storage area to determine whether or not the processing zone is the final zone.

In the case where the processing zone is not determined as a final zone (step S114; NO), the controller 5 returns to step S102. Then, the controller 5 performs processing in steps S103 to 114 in connection with a next zone.

While, in the where the processing zone is determined as a final zone (step S114; YES), the controller 5 ends the device driver read processing.

As explained above, the controller 5 executes the device driver read processing to make it possible to read driver data from the flash memory 1 and to store it in the instruction storage area 21. This eliminates the need for providing the expensive nonvolatile storage medium for storing the device driver in the flash memory drive device, unlike the conventional case. In other words, this makes it possible to implement a low cost flash memory drive device with a simple structure.

When the device driver read processing ends, the controller 5 gains access to the instruction storage area 21, and reads the device driver composed of driver data from the instruction storage area 21.

After that, the controller 5 executes the read device driver so as to generate an available block table and an address conversion table based on the logical block address, etc. stored in the redundant area P of each block included in the flash memory 1 as described in, for example, Unexamined Japanese Patent Application Publication Nos. 2000-305839 and 2000-011677.

The available block table indicates an available block included in the flash memory 1. The memory cells included in the available block are in a state that all are reset. Namely, "1" is stored in all memory cells in the available block.

The address conversion table shows the corresponding relationship between the logical block address, which is used so that the I/O section 3 or controller 5 specifies the processing block, and the physical block address assigned to each block of flash memory 1.

The controller 5 stores the generated available block table and address conversion table in the data storage area 22 of main storage section 2.

The controller 5 uses the stored available block table and address conversion table, making it possible to execute random access to the flash memory 1 via the data storage area 22 on a byte-by-byte basis in a quasi manner. In other words, the controller 5 can execute reading of data from the flash memory 1 and writing of data stored in the flash memory 1 on a byte-by-byte basis in a quasi manner.

Data to be read and data to be written are specified based on data information (logical block address, page address, and data address) supplied from the input section 31.

In the case where data is read, the input section 31 inputs data information that designates data to be read and a reading signal that instructs reading of data to the controller 5 in accordance with the operation performed by the user of flash memory drive device.

The controller 5 searches an address conversion table of the data storage area 22 using the logical block address included in data information supplied from the input section 31 in response to the reading signal from the input section 31. Then, the controller 5 specifies the physical block address that is associated with the supplied logical block address.

The controller 5 gains access to the flash memory 1, and reads data stored in the data area P1 (leading 512 bytes) of the page specified from the specified physical address and the page address included in data information supplied.

Namely, the controller 5 puts "Read Command", zone address, block address, page address, and data address to the flash memory 1.

The flash memory 1 starts reading data from addressed cells after receiving last address, puts read data to an output buffer register, and asserts a ready signal to the controller 5.

Then, the controller 5 reads data from the output buffer register by byte sequentially.

Then, the controller 5 temporarily stores read data in the data storage area 22 of main storage 2.

After that, the controller 5 extracts data specified by the data address included in supplied data information from 512-byte data stored in the data storage area 22.

Then, the controller 5 outputs extracted data and an instruction of outputting data to the outputting section 32.

The output section 32 outputs data supplied from the controller 5 in response to the instruction of output from the controller 5.

While, in the case where data is rewritten, the input section 31 inputs data information that designates data to be rewritten and a rewriting signal that instructs rewriting of data, and the content of rewritten data to the controller 5 in accordance with the operation performed by the user.

The controller 5 searches an address conversion table of the data storage area 22 using the logical block address included in data information supplied from the input section 31 in response to the rewriting signal from the input section 31. Then, the controller 5 specifies the physical block address that is associated with the supplied logical block address.

The controller 5 gains access to the flash memory 1, and reads data stored in the data area P1 (leading 512 bytes) of the page specified from the specified physical address and the page address included in data information supplied.

Namely, the controller 5 puts "Read Command", zone address, block address, page address, and data address to the flash memory 1.

The flash memory 1 starts reading data from addressed cells after receiving last address, puts read data to the output buffer register, and asserts a ready signal to the controller 5.

Then, the controller 5 reads data from the output buffer register by byte sequentially.

Then, the controller 5 temporarily stores read data in the data storage area 22 of the main storage 2.

Sequentially, the controller 5 rewrites data, which is specified by the data address included in the supplied data information among 512-byte data stored in the data storage area 22, to the content of rewritten data supplied.

Next, the controller 5 searches an available block table of the data storage area 22, and specifies an available block.

After that, the controller 5 copies data in the block where data to be rewritten is stored to the specified available block, sequentially. In this case, the controller 5 does not copy data in the page that includes data to be rewritten.

Subsequently, the controller 5 sequentially writes 512-byte data, which includes data rewritten at the data storage area 22, on a portion where no copy is performed. Namely, the controller 5 puts "Data-input Command", zone address, block address, page address, and data address to the flash memory 1.

Next, the controller 5 transfers 512-byte data to an input buffer register of the flash memory 1 by byte sequentially.

Then, the controller 5 puts "Program Command" to the flash memory 1, and the flash memory 1 starts writing data from the input buffer register into addressed cells.

Thereafter, the controller 5 erases data in the block storing data before rewritten, at a time. More specifically, the controller 5 resets the contents recorded on all memory cells included in the block storing data before rewritten. In other words, the controller 5 sets the value, which is stored in each memory cell, to "1."

In addition, when an error occurs at a data erasing time or data writing time, the controller 5 stores an error flag, which represents a post defective block, in the redundant area P2 of the block where the error occurs. After that, the controller 5 searches an available block table of the data storage area 22, and specifies a new available block. The controller 5 writes data in the block where rewriting data is stored on the specified new available block.

After erasing data of the block where data subjected to no rewriting is stored, the controller 5 changes the available block table of the data storage area 22 in order to indicate that the block where data is erased is the available block.

Moreover, the controller 5 changes the address conversion table of the data storage area 22 such that the physical block address of the block where rewritten data is stored is associated with the logical block address supplied from the input section 31.

As explained above, the controller 5 executes the device driver, making it possible to carry out the reading and writing of data stored in the flash memory 1 via the data storage area 22 on a byte-by-byte basis in a quasi manner.

Additionally, the structure of the flash memory 1 is not limited to the aforementioned structure. More specifically, the number of zones, the number of blocks included in one zone, the number of pages included in one block, and the number of memory cells that forms one page are not limited to the aforementioned values. These values may be decided depending on, for example, an access speed that is required for the flash memory 1.

The flash memory 1 may be connected to the flash memory I/F 6 to be attachable and detachable via a PC (Personal Computer) card ATA (AT Attachment) (not shown).

The flash memory 1 may form a memory card such as smart media (trademark) and compact flash (trademark) or the like. In addition, this memory card may be connected to the flash memory I/F 6 to be attachable and detachable via an adapter (not shown).

The controller 5 does not set the initial values of variables Z, B and P to the minimum values "0" in step S101 of the device driver read processing. For example, the controller 5 may set the initial values of variables Z, B and P to the maximum value. More specifically, the controller 5 may set the number of zones "4" included in the storage area of the flash memory 1 as the initial value of variable Z. The controller 5 may set the number of blocks "1024" included in one zone as the initial value of variable B. Moreover, the controller 5 may set the number of pages "32" included in one block as the initial value of variable P.

The controller 5 may decrement the values of variables Z, B and P in place of incrementing them in the device driver read processing. More specifically, the controller 5 may decrement the values of variables Z, B and P stored in the data storage area 22 by one.

For example, in the case where the device driver is stored in the block nearby the end of the storage area included in the flash memory 1, the controller 5 sets the initial values of variables Z, B and P to the maximum values, and decrements the values of variables Z, B and P. This makes it possible for the controller 5 to transfer the device driver to the instruction storage area 22 speedily.

The controller 5 may determine whether or not the all pages in a block are initial defective pages or post defective pages by checking the first page of the block. In this case, if the controller 5 determines that the first page in the block is initial defective page or post defective page, the controller 5 may skip the steps (S106 and S107) when checking the left pages in the block.

The controller 5 does not have to read all data stored in the processing page in the step S105 of the device driver read processing. For example, the controller 5 may read only data included in the redundant area P2 of the processing page to temporarily store in the data storage area 32.

In this case, the controller 5 may gain access to the flash memory 1 to read data stored in the page area P1 of the processing page to store in the instruction storage area 31 in the step S109.

The flash memory 1 may be NAND-type flash memory.

The functions of both the input section 31 and the output section 32 may be realized by an interface circuit that performs data transmission via a bus that is capable of performing bidirectional data transmission. This interface circuit includes, for example, an interface circuit for USB (Universal Serial Bus) or an interface circuit for IEEE (Institute of Electrical and Electronics Engineers) 1394 bus, etc.

The input section 31 may comprise an MP3 encoder that obtains voice (or voice data) is supplied from the external section to generate data in MP3 (MPEG1 audio layer 3) format that represents the obtained voice.

The output section 32 may comprise an MP3 decoder that reproduces voice, which is supplied from the controller 5 via the internal bus 100 and which represents MP3-format data. Or, the output section 32 converts MP3-format data to other formatted data.

Figure 4:
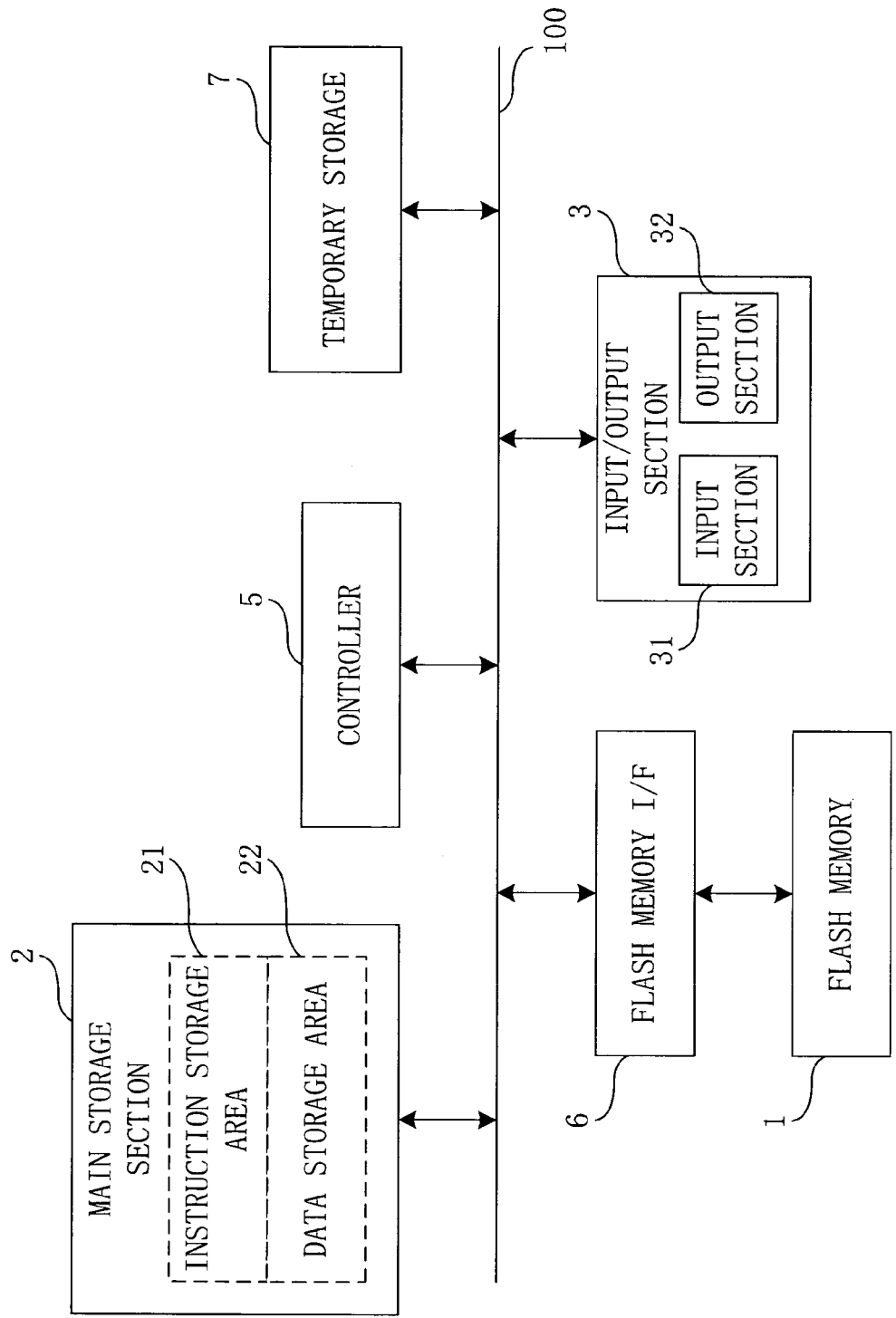
FIG. 4 is a view showing the other structural view of the flash memory device according to the embodiment of the present invention.

As shown in FIG. 4, the flash memory drive device may comprise a temporary storage 7, which is composed of RAM in place of the boot ROM 41 and which fetches a control code supplied from the external section serially to store. In this case, the controller 5 may read the device driver from the flash memory 1 according to the control code that the temporary storage 7 stores.

The controller 5 may have the function of flash memory I/F 6. In this case, the flash memory drive device does not have to comprise the flash memory I/F 6.

The apparatus of the present invention can be realized by a general computer, without the need for a dedicated apparatus. A program and data for controlling a computer to execute the above-described processes may be recorded on a medium (a floppy disk, CD-ROM, DVD or the like) and distributed, and the program may be installed into the computer and run an OS (Operating System) to execute the above-described processes, thereby achieving the apparatus of the present invention.

Moreover, when the OS executes the part of the above-mentioned processes or the OS forms the part of the structural components that the present invention comprises, the program excepting the above part may be stored in the recording medium.

The above program and data may be stored in a disk device or the like included in the server device on the Internet, and embedded in a carrier wave. The program and data embedded in the carrier wave may be downloaded into the computer so as to realize the apparatus of the present invention.

Various embodiments and changes may be made thereunto without departing from the broad spirit and scope of the invention. The above-described embodiment intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2001-76945 filed on Mar. 16, 2001 and including specification, claims, drawings and summary. The disclosure of the above Japanese Patent Application is incorporated herein by reference in its entirety.

What is claimed is:

1. A storage device comprising:
    a first storage unit that comprises a non-volatile storage area made of a plurality of blocks each made of a plurality of memory pages each including a data area for storing data and a redundant area storing a data identification flag indicating whether or not the data stored in said data area is structural data configuring a target program to be executed, and that is accessed in a sequential manner by a unit of said memory page;
    a second storage unit that comprises a non-volatile storage area and that stores a reading program for reading said target program from said first storage unit;
    a third storage unit that comprises a volatile storage area accessed randomly and that stores said target program read from said first storage unit; and
    a control unit that specifies a memory page storing said structural data by using said data identification flag stored in said redundant area of said first storage unit and reads said structural data from said data area of said specified memory page according to said reading program stored in said second storage unit, stores said target program configured by said read structural data in said third storage unit, and executes said target program stored in said third storage unit.

2. The storage device according to claim 1, wherein said reading program includes a program that causes said control unit to specify a memory page that stores said structural data from said plurality of memory pages.

3. The storage device according to claim 2, wherein said first storage unit is formed of NAND type flash memory.

4. The storage device according to claim 2, wherein said reading program includes a program that causes said control unit to detect said data identification flag stored in each of said plurality memory pages and to specify a memory page that stores said structural data using said data identification flag.

5. The storage device according to claim 3, wherein
    said target program is a device driver that makes it possible for said control unit to gain access to the first storage unit randomly in a smaller unit than said memory page unit in a quasi manner; and
    said control unit executes said device driver stored in said third storage unit to gain access to said first storage unit randomly in a smaller unit than said memory page unit in a quasi manner.

6. The storage device according to claim 4, wherein
    said target program is a device driver that makes it possible for said control unit to gain access to the first storage unit randomly in a smaller unit than said memory page unit in a quasi manner; and
    said control unit executes said device driver stored in said third storage unit to gain access to said first storage unit randomly in a smaller unit than said memory page unit in a quasi manner.

7. The storage device according to claim 5, wherein
    each of said plurality of memory pages is assigned a logical address for specifying the memory page; and
    said device driver includes a program that causes said control unit to obtain a logical address for specifying a memory page to be accessed and to gain access to the memory page to which the same logical address as said obtained logical address is assigned.

8. The storage device according to claim 6, wherein
    each of said plurality of memory pages is assigned a logical address for specifying the memory page; and said device driver includes a program that causes said control unit to obtain a logical address for specifying a memory page to be accessed and to gain access to the memory page to which the same logical address as said obtained logical address is assigned.

9. The storage device according to claim 1, wherein said second storage unit obtains said read program supplied externally and stores said obtained reading program.

10. A storage device controlling method comprising the steps of:
specifying a memory page that stores structural data configuring a target program to be executed, from a first storage unit which comprises a non-volatile storage area made of a plurality of blocks each made of a plurality of memory pages each including a data area for storing data and a redundant area for storing a data identification flag indicating whether or not the data stored in said data area is said structural data and which is accessed in a sequential manner in a unit of each said memory page, by using said data identification flag stored in said redundant area according to a reading program for reading said target program;
reading said structural data from said data area of said specified memory page according to said reading program;
storing said target program configured by said read structural data to a third storage unit that comprises a volatile storage area and can be accessed randomly; and
executing said target program stored in said third storage unit.

11. A program for controlling a computer comprising:
a first storage unit that comprises a non-volatile storage unit made of a plurality of blocks each made of a plurality of memory pages each including a data area for storing data and a redundant area for storing data identification flag indicating whether or not the data stored in said data area is structural data configuring a target program to be executed, and that is accessed in a sequential manner by a unit of said memory page;
a second storage unit that comprises a non-volatile storage area and that stores a reading program for reading said target program from said first storage unit; and
a third storage unit that comprises a volatile storage area accessed randomly and that stores said target program read from said first storage unit,
and said program causing said computer to specify a memory page storing said structural data by using said data identification flag stored in said redundant area of said first storage unit and read said structural data from said data area of said specified memory page according to said reading program stored in said second storage unit, store said target program configured by said read structural data in said third storage unit, and execute said target program stored in said third storage unit.

* * * * *